United States Patent
Fang et al.

(10) Patent No.: US 9,825,010 B2
(45) Date of Patent: Nov. 21, 2017

(54) STACKED CHIP PACKAGE STRUCTURE AND MANUFACTURING METHOD THEREOF

(71) Applicant: Powertech Technology Inc., Hsinchu County (TW)

(72) Inventors: Li-Chih Fang, Hsinchu County (TW); Ji-Cheng Lin, Hsinchu County (TW); Che-Min Chu, Hsinchu County (TW); Chun-Te Lin, Hsinchu County (TW); Chien-Wen Huang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/455,143

(22) Filed: Mar. 10, 2017

(65) Prior Publication Data

US 2017/0287874 A1   Oct. 5, 2017

Related U.S. Application Data

(60) Provisional application No. 62/316,843, filed on Apr. 1, 2016.

(51) Int. Cl.
*H01L 25/065* (2006.01)
*H01L 23/31* (2006.01)
(Continued)

(52) U.S. Cl.
CPC ........ *H01L 25/0657* (2013.01); *H01L 21/563* (2013.01); *H01L 23/3128* (2013.01); *H01L 23/3171* (2013.01); *H01L 23/552* (2013.01); *H01L 24/03* (2013.01); *H01L 24/09* (2013.01); *H01L 24/11* (2013.01); *H01L 24/17* (2013.01);
(Continued)

(58) Field of Classification Search
CPC ... H01L 25/0657; H01L 24/03; H01L 21/563; H01L 24/17; H01L 24/11; H01L 23/552; H01L 25/50; H01L 25/0655; H01L 23/3171; H01L 24/09; H01L 23/3128; H01L 2225/06517; H01L 2225/06548; H01L 2224/13021; H01L 2225/06524; H01L 2225/06568; H01L 2225/06558; H01L 2224/0401
See application file for complete search history.

(56) References Cited

U.S. PATENT DOCUMENTS 8,629,546 B1 * 1/2014 Scanlan .............. H01L 24/19
257/686
2014/0168014 A1   6/2014 Chih et al.

* cited by examiner

*Primary Examiner* — Kyoung Lee
(74) *Attorney, Agent, or Firm* — JCIPRNET

(57) ABSTRACT

A stacked chip package structure includes a first chip, pillar bumps, a first encapsulant, a first redistribution layer, a second chip, a second encapsulant, a second redistribution layer and a through via. The pillar bumps are disposed on a plurality of first pads of the first chip respectively. The first encapsulant encapsulates the first chip and exposes the pillar bumps. The first redistribution layer is disposed on the first encapsulant and electrically connects the first chip. The second chip is disposed on the first redistribution layer. The second encapsulant encapsulates the second chip. The second redistribution layer is disposed on the second encapsulant and electrically coupled to the second chip. The through via penetrates the second encapsulant and electrically connects the first redistribution layer and the second redistribution layer.

18 Claims, 9 Drawing Sheets

(51) Int. Cl.
*H01L 23/00* (2006.01)
*H01L 25/00* (2006.01)
*H01L 21/56* (2006.01)
*H01L 23/552* (2006.01)

(52) U.S. Cl.
CPC .......... *H01L 25/0655* (2013.01); *H01L 25/50* (2013.01); *H01L 2224/0401* (2013.01); *H01L 2224/13021* (2013.01); *H01L 2225/06517* (2013.01); *H01L 2225/06524* (2013.01); *H01L 2225/06548* (2013.01); *H01L 2225/06558* (2013.01); *H01L 2225/06568* (2013.01)

US 9,825,010 B2

STACKED CHIP PACKAGE STRUCTURE AND MANUFACTURING METHOD THEREOF

CROSS-REFERENCE TO RELATED APPLICATION

The application claims the priority benefit of U.S. provisional application Ser. No. 62/316,843 filed on Apr. 1, 2016. The entirety of the above-mentioned patent application is hereby incorporated by reference herein and made a part of this specification.

BACKGROUND OF THE INVENTION

Field of the Invention

The present invention generally relates to chip package structure and a manufacturing method thereof. More particularly, the present invention elates to a stacked chip package structure and a manufacturing method thereof.

Description of Related Art

Recently, attention has paid to a semiconductor device called a "substrate with a built-in chip" in which a chip and the like are buried in a substrate made of resin and the like and a semiconductor device in which an insulating layer and a wiring layer are formed on the chip. In semiconductor devices such as a substrate with a built-in chip, it is necessary to embed a chip in the insulating layer, and further form a via hole through the insulating layer to electrically connect an electrode pad on the chip to an external electric terminal.

In general, the via hole is typically formed by using a laser beam. In this case, the laser beam passes through the insulating layer, and the electrode pad of the chip made of Al and the like may be flied apart by irradiation of the laser beam. As a result, the device including a semiconductor chip is disadvantageously damaged.

SUMMARY OF THE INVENTION

Accordingly, the present invention is directed to a stacked chip package structure, which has favourable reliability, lower production cost and thinner overall thickness.

The present invention is further directed to a manufacturing method of the stacked chip package structure, which improves reliability and yield of the stacked chip package structure and reduces production cost and overall thickness of the stacked chip package structure.

The present invention provides a stacked chip package structure including a first chip, a plurality of first pillar bumps, a first encapsulant, a first redistribution layer, a second chip, a plurality of first stud bumps, a second stud bump, a second encapsulant, a second redistribution layer and a through via. The first chip includes a first active surface and a plurality of first pads disposed on the first active surface. The first pillar bumps are correspondingly disposed on the first pads respectively. The first encapsulant encapsulates the first chip and exposes a top surface of the first pillar bumps. The first redistribution layer is disposed on the first encapsulant and electrically coupled to the pillar bumps. The second chip is disposed on the first redistribution layer. The second chip has a second active surface facing away from the first redistribution layer and a plurality of second pads disposed on the second active surface. The first stud bumps are disposed on the second pads respectively. The second stud bump is disposed on the first redistribution layer. The second encapsulant encapsulates the second chip. The second redistribution layer is disposed on the second encapsulant and electrically coupled to the second chip. The through via penetrates the second encapsulant and electrically connects the second stud bump, the first redistribution layer and the second redistribution layer.

The present invention provides a manufacturing method of a stacked chip package structure, and the method includes the following steps. A first chip is disposed on a carrier, wherein the first chip includes a first active surface and a plurality of first pads disposed on the first active surface. A plurality of first pillar bumps are correspondingly formed on the first pads respectively. The first chip is encapsulated by a first encapsulant, wherein the first encapsulant exposes a top surface of each of the first pillar bumps. A first redistribution layer is formed on the first encapsulant, wherein the first redistribution layer is electrically coupled to the first pillar bumps. A second chip is disposed on the first redistribution layer, wherein the second chip has a second active surface facing away from the first redistribution layer and a plurality of second pads disposed on the second active surface. The first stud bumps are formed on the second pads respectively. The second stud bump is formed on the first redistribution layer. The second chip is encapsulated by a second encapsulant. A second redistribution layer is formed on the second encapsulant, wherein the second redistribution layer is electrically coupled to the second chip. A through via is formed to penetrate the second encapsulant and electrically connect the second stud bump, the first redistribution layer and the second redistribution layer. The carrier is removed.

DESCRIPTION OF THE EMBODIMENTS

Figure 1:
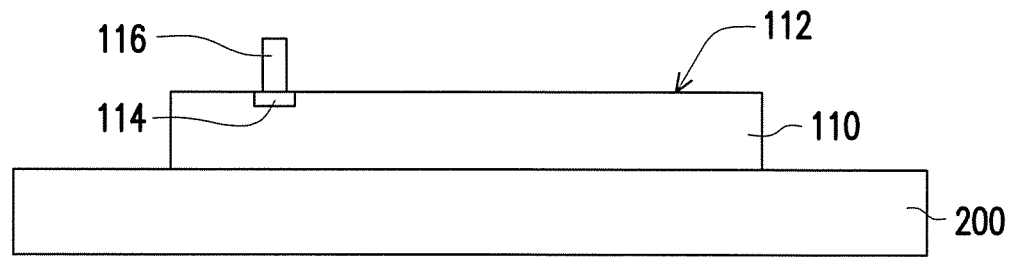
FIG. 1 to FIG. 9 illustrate cross-sectional views of a manufacturing process of a stacked chip package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
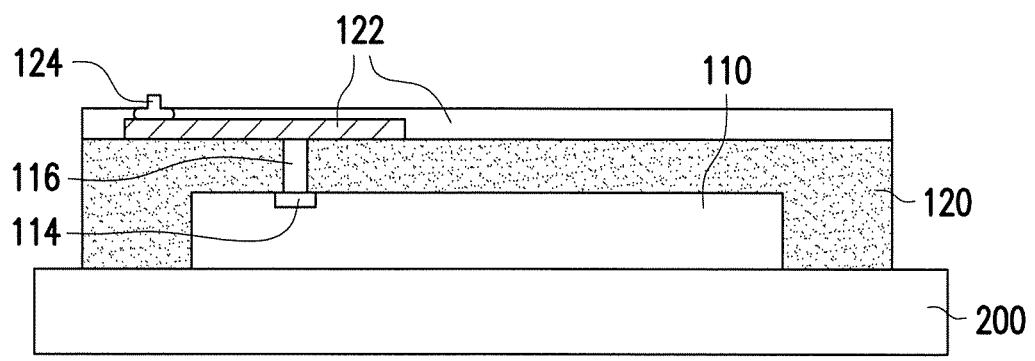

FIG. 1 to FIG. 9 illustrate cross-sectional views of a manufacturing process of a stacked chip package structure according to an embodiment of the invention. In the present embodiment, a manufacturing process of a stacked chip package structure may include the following steps. Referring to FIG. 1 and FIG. 2, a first chip 110 is firstly disposed on a carrier 200. The first chip 110 includes a first active surface 112 facing away from the carrier 200 and a plurality of first pads 114 disposed on the first active surface 112. Then, a plurality of first pillar bumps 116 are correspondingly formed on the first pads 114 respectively. The first pillar bumps 116 may be formed by screen printing or electroplating, but the disclosure is not limited thereto.

Next, referring to FIG. 2, a first encapsulant 120 is formed to encapsulate the first chip 110. The first encapsulant 120 exposes a top surface of each first pillar bump 116. In the present embodiment, the first encapsulant 120 may completely cover the first chip 110 and the first pillar bump 116 disposed on the first chip 110. Then, a grinding process may be performed on the first encapsulant 120 until a top surface of each of the first pillar bump 116 is exposed. As such, a top surface of the first encapsulant 120 is coplanar with the top surface of each of the first pillar bump 116 as shown in FIG. 2. With such configuration, the thickness of the stacked chip package structure may be further reduced, and the process of forming conductive vias for the first chip 110 may be omitted. In this way, the production cost of the stacked chip package structure may be reduced. Then, a first redistribution layer 122 is formed on the first encapsulant 120 as shown in FIG. 2. The first redistribution layer 122 is electrically coupled to the first chip 110 through the first pillar bump 116.

Figure 3:
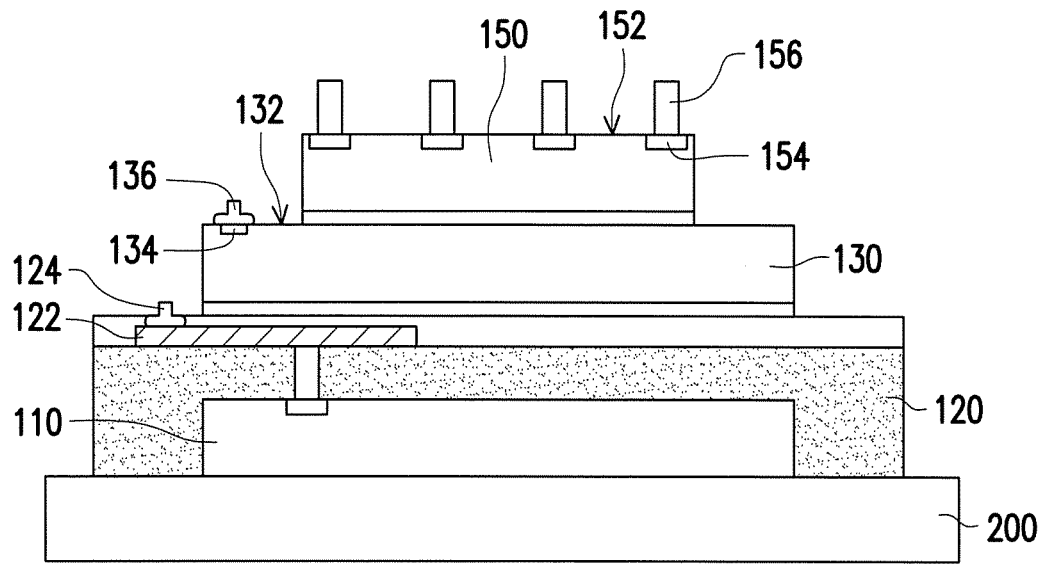
Figure 4:
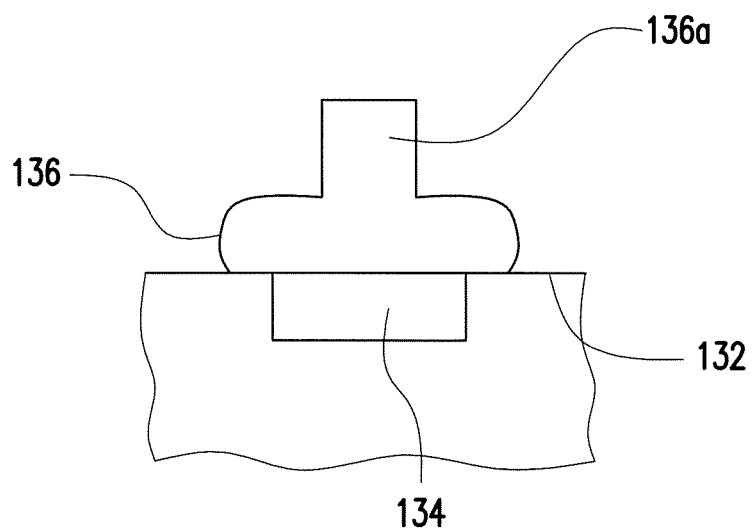

Then, referring to FIG. 3 and FIG. 4, a second chip 130 is disposed on the first redistribution layer 122. The second chip 130 includes a second active surface 132 facing away from the first redistribution layer 122 and a plurality of second pads 134 disposed on the second active surface 132. In the present embodiment, a third chip 150 may further be disposed on the second chip 130. The third chip 150 and the second chip 130 may be stacked on top of each other. The third chip 150 may not cover the second pads 134 of the second chip 130. Similarly, the third chip 150 may include a third active surface 152 facing away from the second chip 130 and a plurality of third pads 154 disposed on the third active surface 152. In the present embodiment, the third chip 150 is disposed in a manner that the third active surface 152 faces the same direction as the second active surface 132. In one embodiment, the third chip 150 may be disposed in a manner that the third active surface 152 and the second active surface 132 respectively face two opposite directions. In the present embodiment, the first chip 110 and the second chip 130 may be flash memories, and the third chip 150 may be a controller, but the disclosure is not limited thereto.

Then, a plurality of first stud bumps 136 are formed on the second pads 134 respectively, and a plurality of second pillar bumps 156 are formed on the third pads 154 respectively. In the present embodiment, each of the first stud bumps 136 may include a protruded knot 136a as shown in FIG. 4. Each of the pillar bumps 116, 156 may be in a pillar shape or also include a protruded knot as shown in FIG. 4. In one embodiment, at least one second stud bump 124 may also be formed on the first redistribution layer 122 as shown in FIG. 2 and FIG. 3. The second stud bump 124 may be in substantially the same shape as the first stud bumps 136 shown in FIG. 4.

Figure 5:
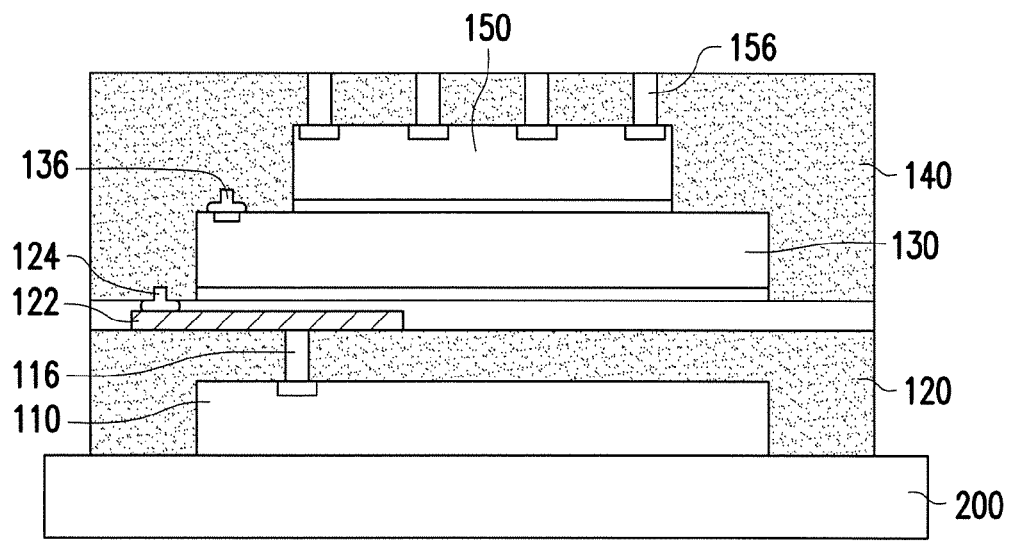

Next, referring to FIG. 5, a second encapsulant 140 is formed to encapsulate the second chip 130 and the third chip 150, and the second encapsulant 140 exposes a top surface of each second pillar bump 156. Similarly, the second encapsulant 140 may completely cover the second chip 130, the third chip 150, and the second pillar bumps 156 disposed on the third chip 150. Then, a grinding process may be performed on the second encapsulant 140 until a top surface of each second pillar bump 156 is exposed, so as to be electrically coupled to a second redistribution layer 142 subsequently formed. In this way, the thickness of the stacked chip package structure may be further reduced, and the process of forming conductive vias for the third chip 150 may be omitted to reduce the production cost of the stacked chip package structure.

Figure 6:
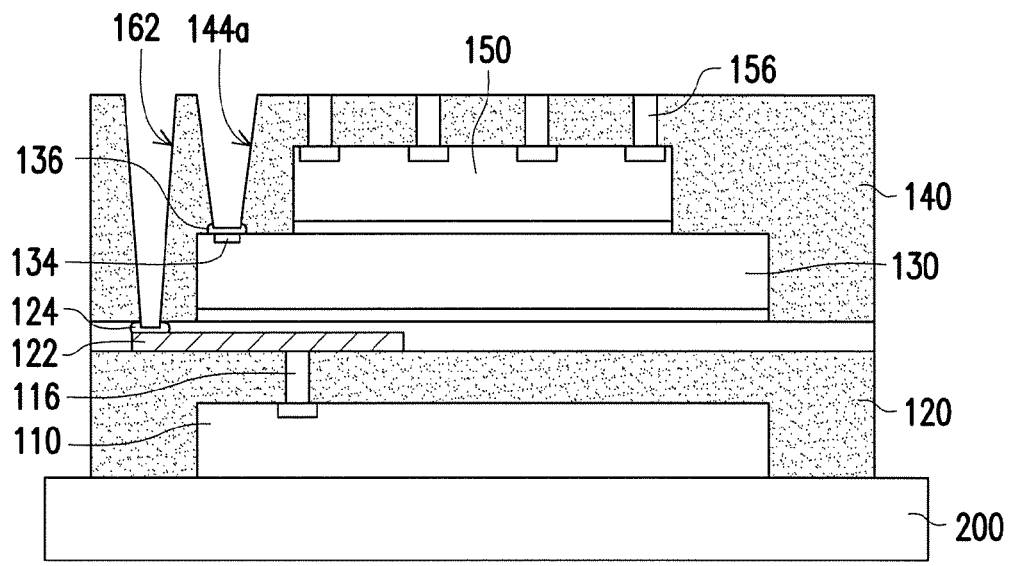
Figure 7:
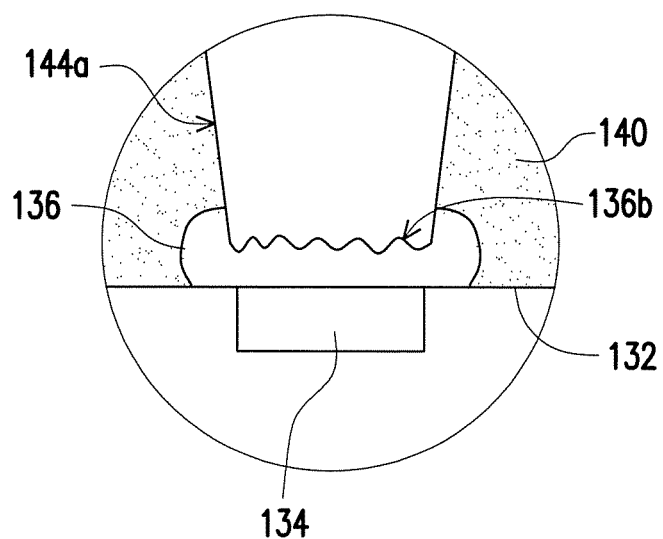

Referring to FIG. 6, a plurality of first vias 144a and a through via hole 162 are formed by laser process. The first vias 144a may penetrate the second encapsulant 140 until the first stud bumps 136 are exposed. The through via hole 162 may penetrate the second encapsulant 140 until the second stud bump 124 are exposed. Accordingly, a top surface of each first stud bump 136 is roughened during the laser process and forms a rough surface 136b (as illustrated in FIG. 7) on each first stud bump 136. Similarly, a top surface of the second stud bump 124 is also roughened during the laser process and forms a rough surface on the second stud bump 124. Therefore, the first stud bumps 136 and the second stud bump 124 are able to prevent the second pads 134 and the first redistribution layer 122 respectively from being damaged during the formation of the first vias 144a and the through via hole 162 respectively. In addition, the rough surface 136b of each first stud bump 136 is rougher than a top surface of each second pad 134. The rough surface 136b may enhance the bonding strength between the first stud bumps 136 and the conductive layer 144b subsequently formed thereon. Therefore, reliability and yield of the stacked chip package structure manufactured by the method described above may be improved. In the present embodiment, the protruded knot 136a of the first stud bump 136 as shown in FIG. 4 is worn off by the laser process, but the disclosure is not limited thereto. In one embodiment, the protruded knot 136a of the first stud bump 136 as shown in FIG. 4 may merely be roughened into a rough knot by the laser process and similar situation is also applied to the second stud bump 124. The rough surface 136b may include a rough knot, and each first conductive vias 144 covers the rough knot of each first stud bump 136.

Figure 8:
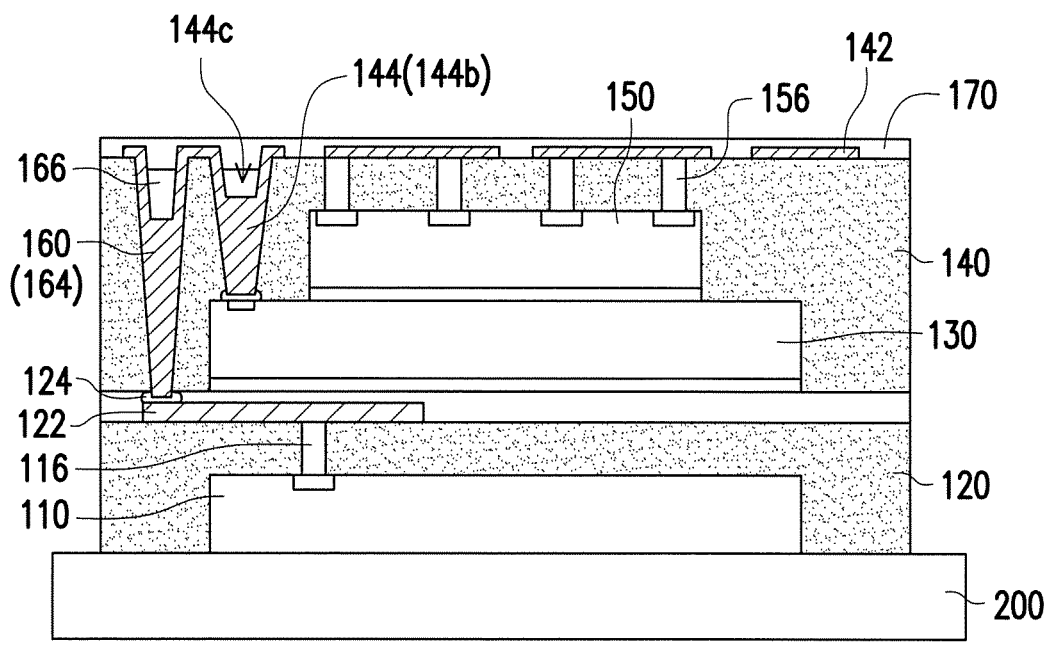

Next, referring to FIG. 8, a conductive layer 144b is formed in he first vias 144a to form a plurality of first conductive vias 144. The conductive layer 144b covers the rough surface 136b of each first stud bump 136 as shown in FIG. 7. The rough surface 136b may enhance the bonding strength between the first stud bumps 136 and the conductive layer 144b. As such, the first conductive vias 144 may penetrate the second encapsulant 140 to cover and couple to the first stud bumps 136 to electrically connect to a second redistribution layer 142 subsequently formed. In the present embodiment, the conductive layer 144b may be a metal layer configured to cover the inner surface of the first via 144a without completely filling the first via 144a. A void 144c may exist in the first conductive via 144, but the invention is not limited thereto. A conductive layer 164 is formed in the through via hole 162 to form the through via 160 coupled to the first redistribution layer 122. The conductive layer 164 may be configured to cover the rough surface of the second stud bump 124. The rough surface of the second stud bump 124 may enhance the bonding strength between the second stud bump 124 and the through via 160. As such, the through via 160 may penetrate the second encapsulant 140 and electrically connect the first redistribution layer 122 and a subsequently formed second redistribution layer 142. The second pillar bumps 156 are electrically coupled to the first redistribution layer 122 through the through via 160.

Then, a second redistribution layer 142 is formed on the second encapsulant 140. The second redistribution layer 142 is electrically coupled to the second chip 130 and the third chip 150 respectively through the first conductive vias 144 and the second pillar bumps 156. The through via 144 are configured to electrically connect the first redistribution layer 122 and the second redistribution layer 142. The metal layer of the second redistribution layer 142 may be formed in the same process and the same step as forming of the conductive layer 144b.

Figure 9:
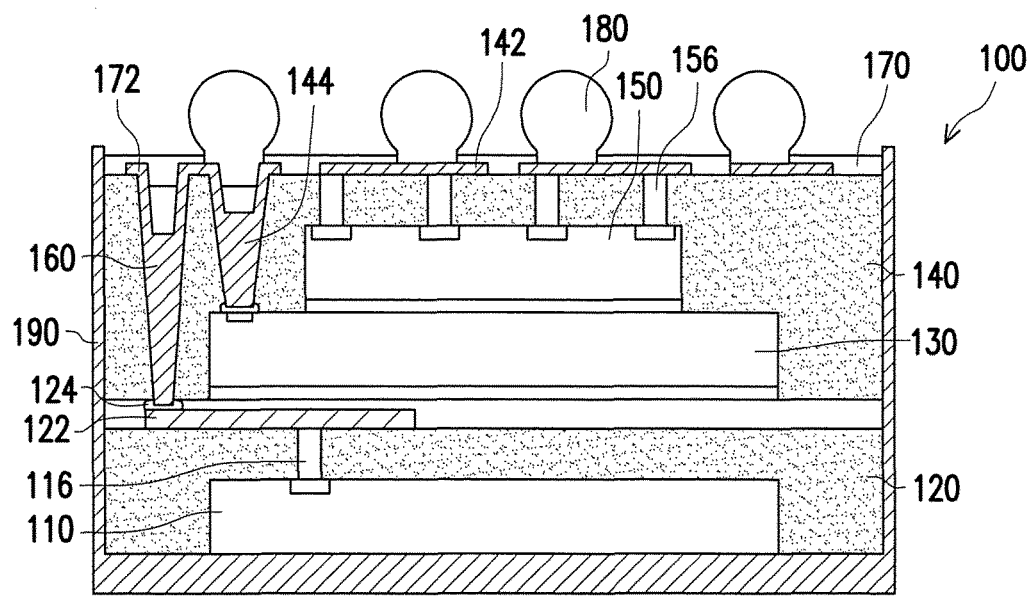

Referring to FIG. 9, a passivation layer 170 is formed on the second redistribution layer 142. The passivation layer 170 may include a plurality of openings 172 exposing a part of the second redistribution layer 142. Then, the carrier 200 may be removed. A shielding layer 190 may be formed on the back surface of the first chip 110, an outer surface of the encapsulants 120, 140 and a lateral surface of the first redistribution layer 122 and the second redistribution layer 142 to protect the stacked chip package structure 100 from environmental, thermal, and electromagnetic interference. In one embodiment, the shielding layer 190 may be coupled to a first conductive circuit of the the first redistribution layer 122 and/or a second conductive circuit of the second redistribution layer 142. The shielding layer 190 may be coupled to a power supply or a ground of the stacked chip package structure 100 according to the need of the circuit layout in the stacked chip package structure 100. Also, a plurality of solder balls 180 may be formed on the openings 172 of the passivation layer 170. The solder balls 180 are electrically coupled to the second redistribution layer 142 exposed by the openings 172 to electrically connect the stacked chip package structure 100 to an external device. At the time, the manufacturing process of the stacked chip package structure 100 may be substantially done.

FIG. 10 to FIG. 14 illustrate cross-sectional views of a manufacturing process of a stacked chip package structure according to another embodiment of the invention. It is noted that the manufacturing process of the stacked chip package structure 100a as shown in FIG. 10 to FIG. 14 contains many features same as or similar to the manufacturing process of the stacked chip package structure 100 disclosed earlier with FIG. 1 to FIG. 9. For purpose of clarity and simplicity, detail description of same or similar features may be omitted, and the same or similar reference numbers denote the same or like components.

Figure 10:
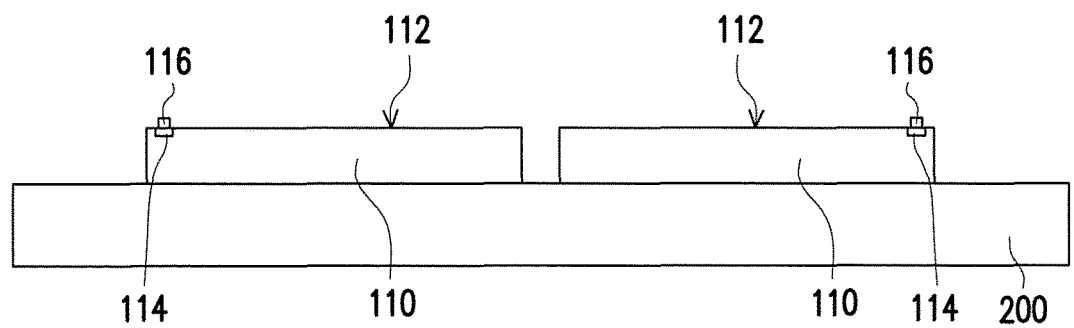
FIG. 10 to FIG. 14 illustrate cross-sectional views of a manufacturing process of a stacked chip package structure according to another embodiment of the invention.
Figure 11:
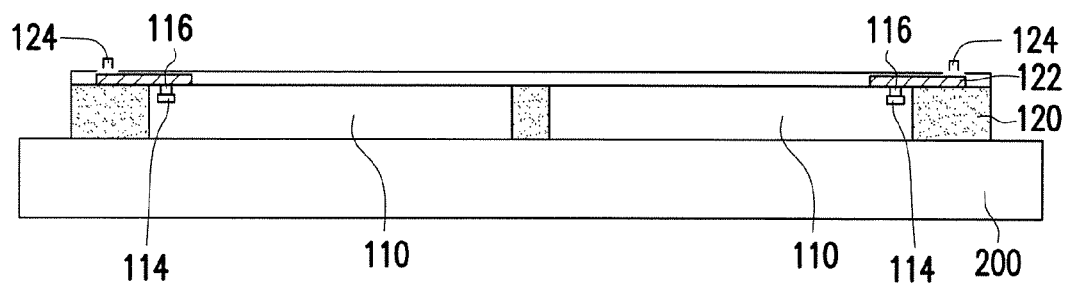

In the present embodiment, there may be a plurality of first chips 110. The plurality of first chips 110 are disposed on the carrier 200. The first chips 110 are arranged in a side-by-side manner as shown in FIG. 10. Then, the first chips 110 are encapsulated by the first encapsulant 120. The first encapsulant 120 may expose the top surface of the first pillar bumps 116 of the first chips 110 as shown in FIG. 11. The first redistribution layer 122 may then formed on the first encapsulant 120 and may be electrically coupled to the first pillar bumps 116 of the first chips 110.

Figure 12:
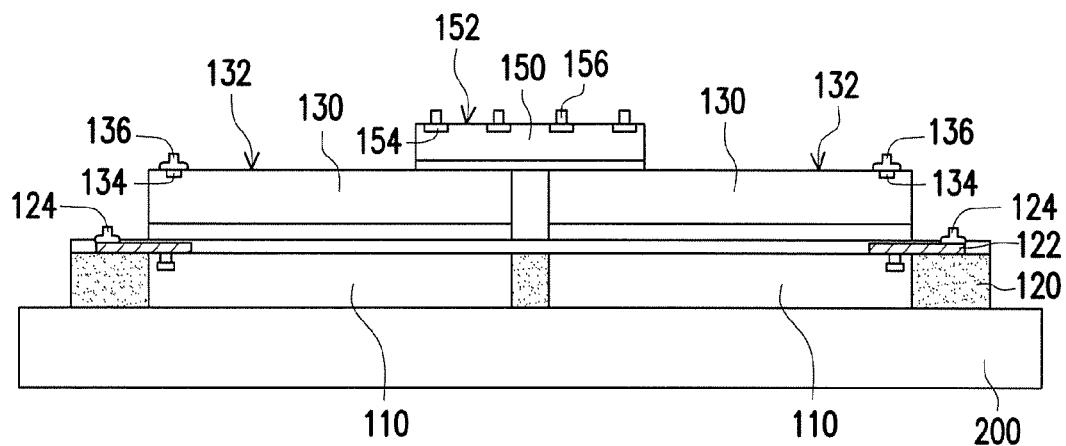
Figure 13:
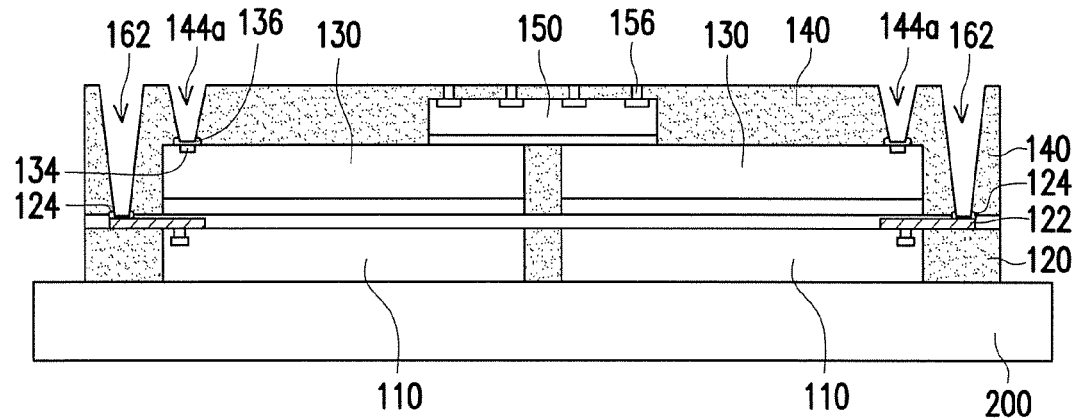
Figure 14:
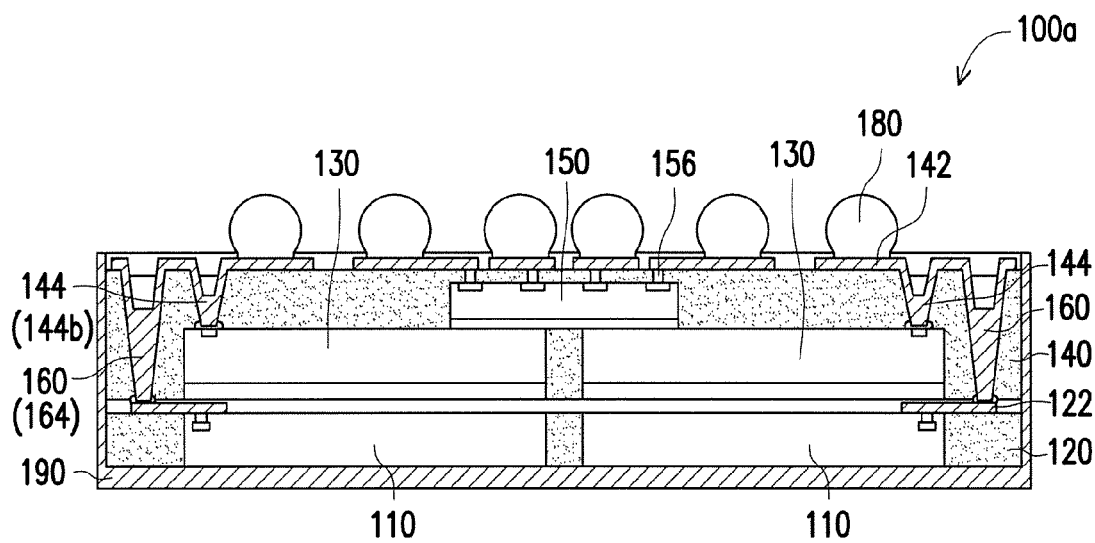

In the present embodiment, there may also be a plurality of second chips 130. The second chips 130 may also be arranged in a side-by-side manner on the first redistribution layer 122 as shown in FIG. 12. The third chip 150 may be disposed on the second chips 130. Then, referring to FIG. 13 and FIG. 14, the second chip 130 are encapsulated by the second encapsulant 140. The second encapsulant 140 may expose the top surface of the second pillar bumps 156 of the third chip 150. Then, the first conductive vias 144, the through via 160, the second redistribution layer 142, the passivation layer 170, the solder balls 180 and the shielding layer 190 may be formed by the same process described in the earlier embodiments to form the stacked chip package structure 100a shown in FIG. 14.

FIG. 15 to FIG. 18 illustrate cross-sectional views of a manufacturing process of a stacked chip package structure according to yet another embodiment of the invention. It is noted that the manufacturing process of the stacked chip package structure 100b as shown in FIG. 15 to FIG. 18 contains many features same as or similar to the manufacturing method of the stacked chip package structure 100 disclosed earlier with FIG. 1 to FIG. 9. For purpose of clarity and simplicity, detail description of same or similar features may be omitted, and the same or similar reference numbers denote the same or like components.

Figure 15:
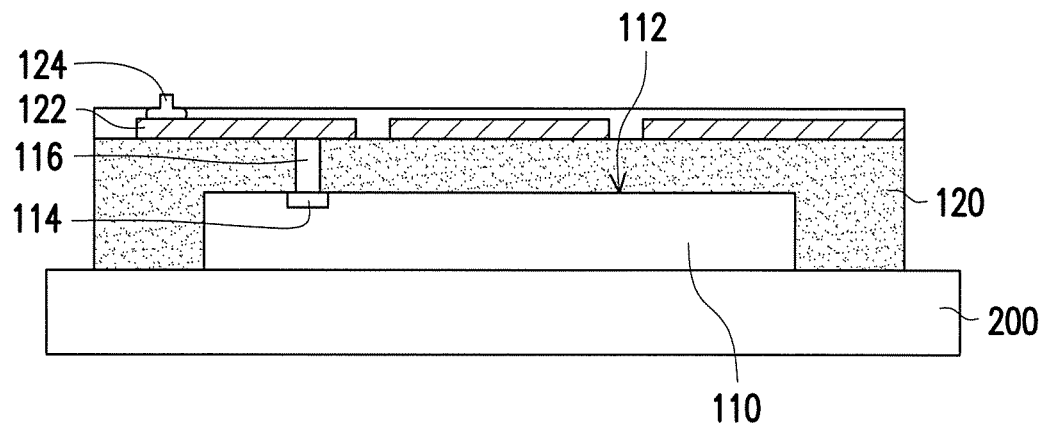
FIG. 15 to FIG. 18 illustrate cross-sectional views of a manufacturing process of a stacked chip package structure according to yet another embodiment of the invention.
Figure 16:
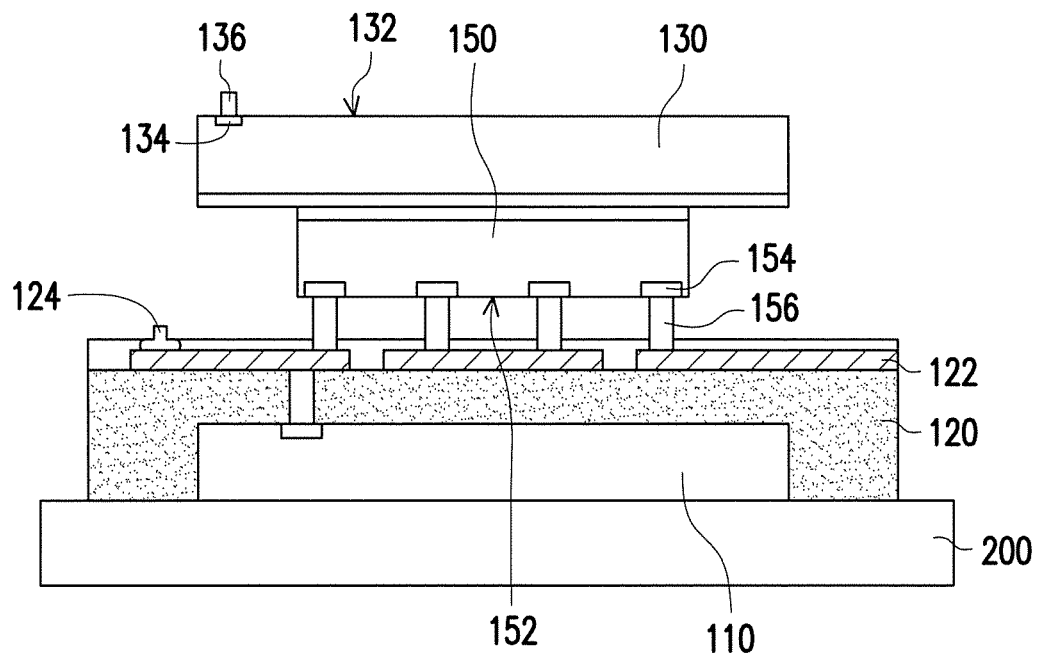

In the present embodiment, a structure shown in FIG. 2 is provided in FIG. 15. Then, before the second chip 130 is disposed on the first redistribution layer 122, a third chip 150 is firstly disposed on the first redistribution layer 122, such that the third chip 150 is located between the first chip 110 and the second chip 130. The third chip 150 includes a third active surface 152 facing the first redistribution layer 122 and a plurality of third pads 154 disposed on the third active surface 152. In the present embodiment, the second pillar bumps 156 may be firstly formed on the third pads 154 respectively, and then disposed on the first redistribution layer 122. The second pillar bumps 156 are electrically coupled to the first redistribution layer 122.

Figure 17:
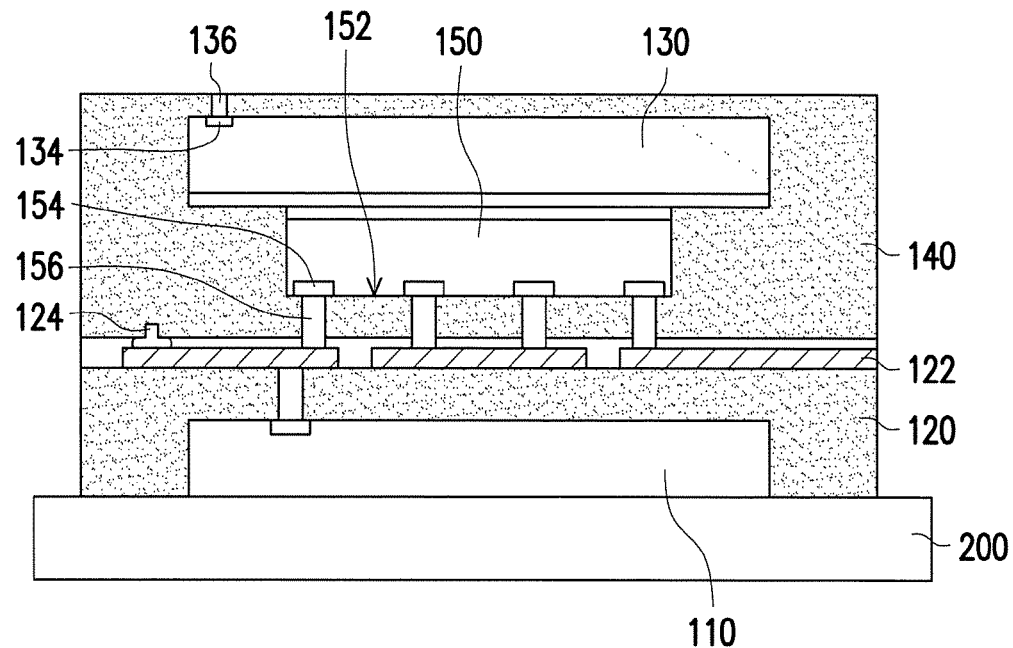
Figure 18:
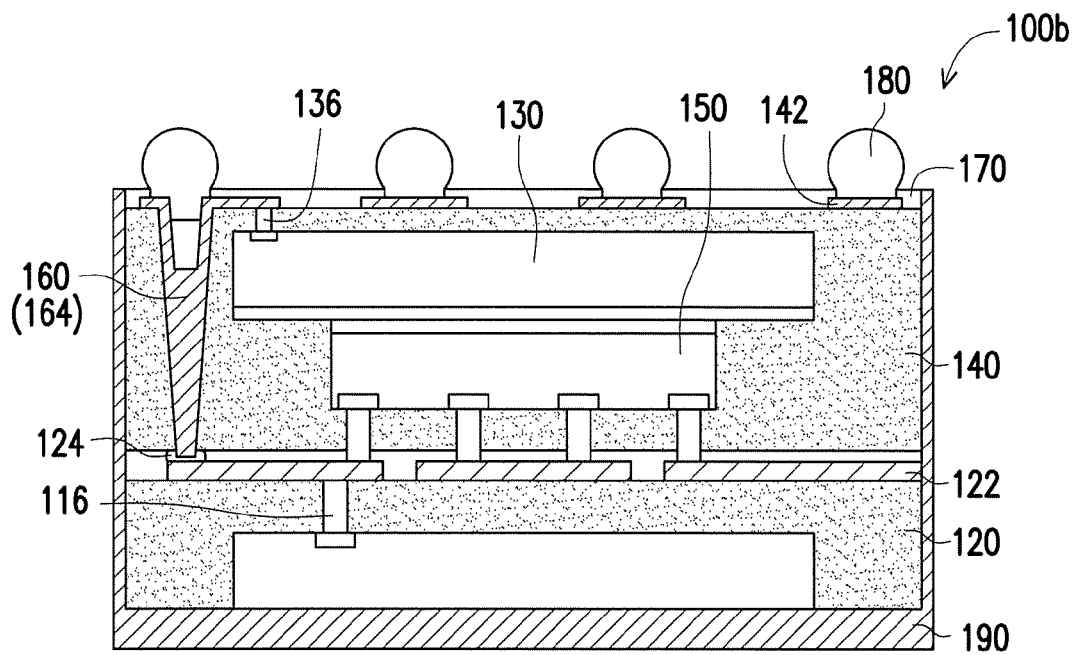

Referring to FIG. 17, a plurality of third pillar bumps 136 are formed on the second pads 134 of the second chip 130 respectively. The second encapsulant 140 may expose a top surface of each of the third pillar bumps 136. The third pillar bumps 136 may be electrically coupled to the second redistribution layer 142 subsequently formed. Thus, the thickness of the stacked chip package structure 100b may be further reduced and the process of forming conductive vias for the second chip 130 may be omitted to reduce the production cost of the stacked chip package structure 100b. Then, the through via 160, the second redistribution layer 142, the passivation layer 170, the solder balls 180 and the shielding layer 190 may be formed by the same process described in the earlier embodiments to form the stacked chip package structure 100b shown in FIG. 18.

In sum, in the present invention, at least one chip is disposed on the carrier. Then, the encapsulant is formed to encapsulate the chip and expose the pillar bumps on the chip, and the redistribution layer is formed on the encapsulant to electrically connect the chip. Then, multiple chips are sequentially stacked on the redistribution layer, and the steps of forming pillar bumps/stud bumps, encapsulant and redistribution layer may be repeated to form the stacked chip package structure. With such configuration, the overall thickness of the stacked chip package structure may be reduced, and the process of forming conductive vias for the topmost chip may be omitted, so as to reduce the production cost of the stacked chip package structure.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A stacked chip package structure, comprising:
  a first chip comprising a first active surface and a plurality of first pads disposed on the first active surface;
  a plurality of first pillar bumps correspondingly disposed on the first pads;
  a first encapsulant encapsulating the first chip and exposing a top surface of the first pillar bumps;
  a first redistribution layer disposed on the first encapsulant and electrically coupled to the first pillar bumps;
  a second chip disposed on the first redistribution layer, the second chip having a second active surface facing away from the first redistribution layer and a plurality of second pads disposed on the second active surface;
a plurality of first stud bumps correspondingly disposed on the second pads;
a second stud bump disposed on the first redistribution layer;
a second encapsulant encapsulating the second chip;
a second redistribution layer disposed on the second encapsulant and electrically coupled to the second chip; and
a through via penetrating the second encapsulant and electrically connecting the second stud bump, the first redistribution layer and the second redistribution layer.

2. The stacked chip package structure as claimed in claim 1, further comprising:
a passivation layer disposed on the second redistribution layer and having a plurality of openings exposing a part of the second redistribution layer; and
a plurality of solder balls disposed on the openings of the passivation layer and electrically coupled to the second redistribution layer.

3. The stacked chip package structure as claimed in claim 1, further comprising a shielding layer disposed on an outer surface of the first encapsulant and the second encapsulant and a lateral surface of the first redistribution layer and the second redistribution layer.

4. The stacked chip package structure as claimed in claim 3, wherein the shielding layer is coupled to a power supply or a ground and is coupled to a first conductive circuit of the the first redistribution layer and/or a second conductive circuit of the second redistribution layer.

5. The stacked chip package structure as claimed in claim 1, wherein each of the first stud bumps comprises a first rough surface, the first rough surface of each of the first stud bumps is covered by a conductive via penetrating the second encapsulant and configured to electrically connect the first stud bumps and the second redistribution layer, the second stud bump comprises a second rough surface, and the second rough surface of the second stud bump is covered by the through via configured to electrically connect the second stud bump, the first redistribution layer, and the second redistribution layer.

6. The stacked chip package structure as claimed in claim 1, further comprising:
a third chip stacked on the second chip and exposing the second pads, the third chip comprising a third active surface facing away from the second chip and a plurality of third pads disposed on the third active surface, and the third chip encapsulated by the second encapsulant; and
a plurality of second pillar bumps disposed on the third pads respectively.

7. The stacked chip package structure as claimed in claim 6, wherein the third chip is disposed in a manner that the third active surface faces the same direction as the second active surface, and the second pillar bumps are electrically coupled to the second redistribution layer.

8. The stacked chip package structure as claimed in claim 6, wherein the third chip is disposed in a manner that the third active surface and the second active surface respectively face two opposite directions, and the second pillar bumps are electrically coupled to the first redistribution layer.

9. The stacked chip package structure as claimed in claim 1, wherein the number of the second chip is plural, the second chips are arranged in a side-by-side manner, and the third chip is disposed on the second chips.

10. The stacked chip package structure as claimed in claim 1, wherein the number of the first chip is plural, and the first chips are arranged in a side-by-side manner.

11. A manufacturing method of a stacked chip package structure, comprising:
disposing a first chip on a carrier, wherein the first chip comprises a first active surface and a plurality of first pads disposed on the first active surface;
forming a plurality of first pillar bumps correspondingly on the first pads;
encapsulating the first chip by a first encapsulant, wherein the first encapsulant exposes a top surface of each of the first pillar bumps;
forming a first redistribution layer on the first encapsulant, wherein the first redistribution layer is electrically coupled to the first pillar bumps;
disposing a second chip on the first redistribution layer, wherein the second chip having a second active surface facing away from the first redistribution layer and a plurality of second pads disposed on the second active surface;
forming a plurality of first stud bumps on the second pads respectively; forming a second stud bump on the first redistribution layer;
encapsulating the second chip by a second encapsulant;
forming a second redistribution layer on the second encapsulant, wherein the second redistribution layer is electrically coupled to the second chip; and
forming a through via penetrating the second encapsulant and electrically connecting the second stud bump, the first redistribution layer and the second redistribution layer; and
removing the carrier.

12. The manufacturing method of the stacked chip package structure as claimed in claim 11, further comprising:
forming a passivation layer on the second redistribution layer, wherein the passivation layer comprises a plurality of openings exposing a part of the second redistribution layer; and
forming a plurality of solder balls on the openings of the passivation layer and electrically coupled to the second redistribution layer.

13. The manufacturing method of the stacked chip package structure as claimed in claim 11, further comprising:
forming a shielding layer on an outer surface of the first encapsulant and the second encapsulant and a lateral surface of the first redistribution layer and the second redistribution layer.

14. The manufacturing method of the stacked chip package structure as claimed in claim 13, wherein the shielding layer is coupled to a power supply or a ground and is coupled to a first conductive circuit of the the first redistribution layer and/or a second conductive circuit of the second redistribution layer.

15. The manufacturing method of the stacked chip package structure as claimed in claim 11, further comprising:
forming a plurality of first vias by a laser process, wherein the first vias penetrate the second encapsulant and expose the first stud bumps respectively, a top surface of each of the first stud bumps is roughened by the laser process to form a rough surface; and
forming a conductive layer in the first vias to form a plurality of first conductive vias, wherein the conductive layer covers the rough surface of each of the first stud bumps and electrically coupled to second redistribution layer, wherein the step of forming the through via further comprises:

forming a through via hole by a laser process, wherein the through via hole penetrate the second encapsulant and expose the second stud bump, a top surface of the second stud bump is roughened by the laser process to form a rough surface; and forming a conductive layer in the through via hole to form the through via, wherein the conductive layer covers the rough surface of the second stud bump and electrically coupled to first redistribution layer.

16. The manufacturing method of the stacked chip package structure as claimed in claim 11, further comprising:

disposing a third chip on the second chip, wherein the third chip exposes the second pads and comprises a third active surface facing away from the second chip and a plurality of third pads disposed on the third active surface; and forming a plurality of second pillar bumps on the third pads respectively, wherein a top surface of each of the second pillar bumps is exposed by the second encapsulant, and the second pillar bumps are electrically coupled to the second redistribution layer.

17. The manufacturing method of the stacked chip package structure as claimed in claim 16, wherein the number of the second chip is plural, the second chips are arranged in a side-by-side manner, and the third chip is disposed on the second chips.

18. The manufacturing method of the stacked chip package structure as claimed in claim 11, wherein the number of the first chip is plural, and the first chips are arranged in a side-by-side manner.

* * * * *